(12) United States Patent
Kalyanasundaram et al.

(10) Patent No.: US 10,555,436 B1
(45) Date of Patent: Feb. 4, 2020

(54) ELECTRONIC DEVICE WITH THERMAL MANAGEMENT SYSTEM

(71) Applicant: Apple Inc., Cupertino, CA (US)

(72) Inventors: Nagarajan Kalyanasundaram, San Jose, CA (US); Keith Cox, Sunnyvale, CA (US); John M. Ananny, San Mateo, CA (US); Gaurav Kapoor, Santa Clara, CA (US); Amaury J. Heresztyn, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 788 days.

(21) Appl. No.: 14/843,340

(22) Filed: Sep. 2, 2015

Related U.S. Application Data (60) Provisional application No. 62/044,518, filed on Sep. 2, 2014.

(51) Int. Cl.
*H05K 7/20* (2006.01)
*G05B 13/04* (2006.01)

(52) U.S. Cl.
CPC ......... *H05K 7/20209* (2013.01); *G05B 13/04* (2013.01)

(58) Field of Classification Search
CPC .............................. H05K 7/20209; G05B 13/04
See application file for complete search history.

(56) References Cited

U.S. PATENT DOCUMENTS

| | | | |
|---|---|---|---|
| 8,452,323 B2 * | 5/2013 | Anderson | H04B 1/005 455/522 |
| 8,484,496 B2 | 7/2013 | Anderson et al. | |
| 8,554,389 B2 * | 10/2013 | Cox | G06F 1/203 320/144 |
| 8,768,530 B2 | 7/2014 | Liang et al. | |
| 9,720,467 B2 * | 8/2017 | Jain | G06F 1/206 |
| 2007/0027580 A1 * | 2/2007 | Ligtenberg | G05D 23/19 700/300 |
| 2007/0142976 A1 * | 6/2007 | Tezuka | G05D 23/19 700/300 |

(Continued)

OTHER PUBLICATIONS

Machine translation of JPH01-237794, Nakamura Ryozo, Handle Display for Automatic Machine, Sep. 22, 1989, 2 pages.*
JPH01237794 Translation from Espacenet (Year: 1989).*

*Primary Examiner* — Thomas C Lee
*Assistant Examiner* — Charles Cai
(74) *Attorney, Agent, or Firm* — Treyz Law Group, P.C.; G. Victor Treyz; Michael H. Lyons (57) ABSTRACT

An electronic device may have electrical components that produce heat during operation. An electronic device may also be heated by sunlight incident on the device. A thermal management model may take into account device structures such as housing materials in modeling the thermal behavior of the device. Temperature sensors in the device may be used to measure internal temperatures. The model may use temperature measurements and other data such as environmental data measured with sensors in predicting temperatures for one or more regions in a device. In response to prediction of a temperature greater than a predetermined threshold, the device may take remedial action to avoid overheating. Remedial action may include adjusting electrical components so that they produce less heat, activating a heat blocking component such as an electronic shutter, and reducing communications activity levels and other software activity levels.

20 Claims, 4 Drawing Sheets

(56) References Cited

U.S. PATENT DOCUMENTS

| | | | |
|---|---|---|---|
| 2008/0269954 A1* | 10/2008 | Lev | G05D 23/19 |
| | | | 700/299 |
| 2010/0057359 A1* | 3/2010 | Caballero | G01C 21/165 |
| | | | 701/472 |
| 2011/0301777 A1* | 12/2011 | Cox | G06F 1/206 |
| | | | 700/299 |
| 2012/0243854 A1* | 9/2012 | Takimoto | G03B 17/08 |
| | | | 396/26 |
| 2012/0311357 A1 | 12/2012 | Andrews | |
| 2013/0172045 A1* | 7/2013 | Caballero | H04B 1/3838 |
| | | | 455/552.1 |
| 2013/0176512 A1* | 7/2013 | Posner | G02F 1/1333 |
| | | | 349/33 |
| 2014/0191588 A1* | 7/2014 | Stevens | G06F 1/1632 |
| | | | 307/125 |
| 2014/0307356 A1* | 10/2014 | Hong | H02H 5/083 |
| | | | 361/78 |
| 2014/0353300 A1 | 12/2014 | Swiatek et al. | |
| 2015/0000889 A1 | 1/2015 | Bellamkonda et al. | |
| 2015/0192976 A1* | 7/2015 | Jeganathan | G06F 1/206 |
| | | | 713/320 |
| 2015/0382305 A1* | 12/2015 | Drincic | H04W 52/0209 |
| | | | 455/574 |
| 2016/0021617 A1* | 1/2016 | Hsiao | H04W 52/0277 |
| | | | 455/456.6 |
| 2016/0299233 A1* | 10/2016 | Levien | G01C 21/00 |

\* cited by examiner

ELECTRONIC DEVICE WITH THERMAL MANAGEMENT SYSTEM

CROSS REFERENCE TO RELATED APPLICATION

This application claims priority to U.S. provisional patent application No. 62/044,518, filed Sep. 2, 2014, which is hereby incorporated by reference herein in its entirety.

BACKGROUND

This relates generally to electronic devices, and, more particularly, to thermal management in electronic devices.

Electronic devices include electronic components such as integrated circuits, displays, and other circuitry. During operation, these components may generate heat. For example, a wireless circuit in an electronic device may generate heat when performing wireless downloading operations. An electronic device with a display may generate heat when displaying content on the display.

Electronic devices may come into contact with the body of a user. Electronic devices may also contain temperature sensitive components and structures. If care is not taken, a device may overheat during operation, leading to a risk of damage to temperature sensitive components or the production of uncomfortably high temperatures where the device is contacting the body of the user. Some devices automatically cease operation if a temperature threshold is exceeded, but this type of abrupt shutdown of a device disrupts device functions and may create a significant inconvenience for a user.

It would therefore be desirable to be able to provide an electronic device with improved thermal management capabilities.

SUMMARY

An electronic device may have electrical components such as integrated circuits, a display, and other components. The electrical components may produce heat during operation. An electronic device may also be heated by sunlight incident on the device. Heat may cause portions of the electronic device such as a display on the front of the device or a housing wall on the rear of the device to experience undesired temperature rises.

A thermal management model may take into account device structures such as housing materials in modeling the thermal behavior of the device. Temperature sensors in the device may be used to measure internal temperatures. Sensors such as accelerometers, moisture sensors, satellite navigation system circuits, and other sensors may make measurements on the operating environment of the device. The model may use temperature measurements and other data such as environmental data in predicting temperatures for one or more regions in a device such as the front and rear faces of the device.

In response to predicting a temperature greater than a predetermined threshold, the model may take remedial action to avoid overheating of the device. Remedial action may include adjusting electrical components so that they produce less heat, activating a heat blocking component such as an electronic shutter, and reducing communications activity levels and other software activity levels in a device to reduce heat production.

DETAILED DESCRIPTION

The operating temperature of various portions of an electronic device may be affected by the operation of heat-generating components within the electronic device, the nature of the device housing and other device properties, and environment effects such as ambient temperature, device location and orientation, and the amount of solar radiation incident on a device. In addition to monitoring the operational status of electrical components in an electronic device, an electronic device may use temperature sensors to make real time temperature measurements within the device. A closed loop thermal management model or other thermal management system may take account of component usage, environmental data, measured temperature, device properties, and other data to determine the temperature of portions of an electronic device. Actions may then be taken based on model predictions of temperature. For example, component settings may be adjusted, heat-producing activities can be deferred or resumed, heat-blocking components can be adjusted, and other actions can be taken.

Figure 1:
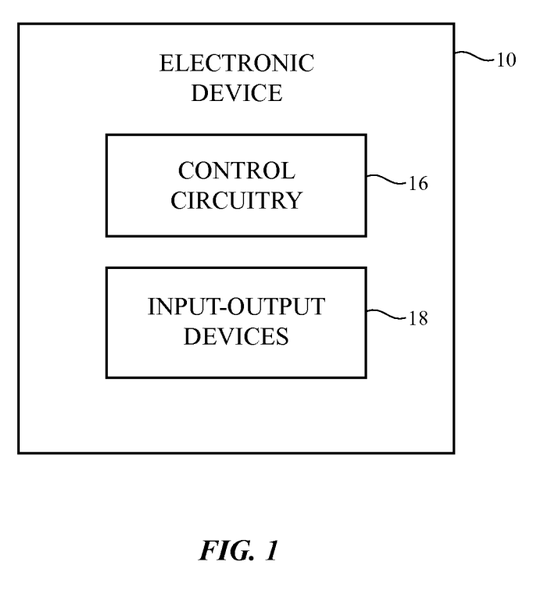
FIG. 1 is a schematic diagram of an illustrative electronic device in accordance with an embodiment.

An illustrative electronic device of the type that may implement a closed loop thermal management model or other thermal management system is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors and other wireless communications circuits, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors such as touch sensors, capacitive proximity sensors, light-based proximity sensors, ambient light sensors, compasses, gyroscopes, accelerometers, moisture sensors, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays. Device 10 may, for example, include a touch screen display that includes a touch sensor for gathering touch input from a user or a display that is insensitive to touch. A touch sensor for a display in device 10 may be based on an array of capacitive touch sensor electrodes, acoustic touch sensor structures, resistive touch components, force-based touch sensor structures, a light-based touch sensor, or other suitable touch sensor arrangements.

Power for device 10 may be provided by an external source of power and/or an internal battery. The components for device 10 such as circuitry 16 and devices 18 and other structures in device 10 may be implemented using integrated circuits, discrete components (e.g., resistors, capacitors, inductors), microelectromechanical systems (MEMS) devices, portions of housing structures, packaged parts, and other devices and structures.

Control circuitry 16 may be used to run software on device 10 such as operating system code and applications. During operation of device 10, the software running on control circuitry 16 may display images for a user on one or more displays and may use other internal components such as input-output devices 18. Device 10 may use communications circuits in input-output devices 18 (e.g., transceiver circuitry, power amplifiers to amplify transmitted signals, low-noise amplifiers to amplify incoming signals, etc.) to send and receive wireless data. Device 10 may also use wired communications circuits (e.g., transceivers, etc.) to transmit and receive digital data. If desired, device 10 may use light-emitting components to transmit data and may use light-receiving components to receive transmitted light signals. Device 10 may also use light-emitting components, light-receiving components, audio components, capacitive sensors, microelectromechanical systems devices, and other components as sensors and output devices. Device 10 may use wireless circuits in circuitry 16 (e.g., a baseband processor and associated radio-frequency transceiver circuitry) to transmit and receive wireless signals. For example, device 10 may transmit and receive cellular telephone signals and/or wireless local area network signals or other wireless data.

If device 10 overheats, device 10 might be uncomfortably warm when touched by a user. Sensitive components within device 10 (e.g., circuitry 16 and/or 18, etc.) might also be damaged. To maintain satisfactory temperatures for device 10 during device operation (i.e., to prevent overheating), control circuitry 16 preferably implements a thermal management system (sometimes referred to as a closed loop thermal management model or a thermal management model). The thermal management system may estimate the temperature of device 10 at one or more locations within device 10 based on data on the usage of device 10. These temperature estimates may then be compared to predetermined thresholds and the comparison results used to determine what actions should be taken within device 10.

Figure 2:
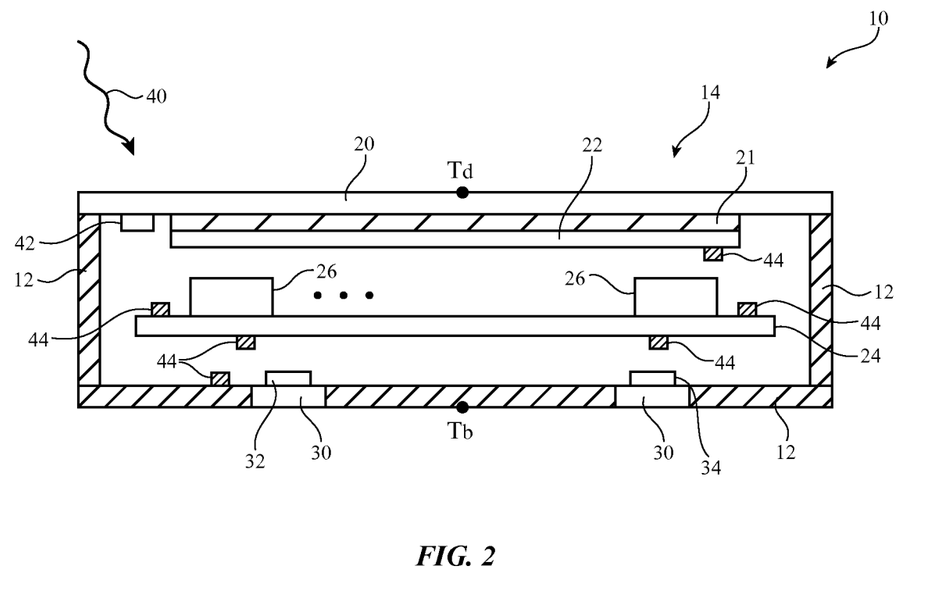
FIG. 2 is a cross-sectional side view of an illustrative electronic device in accordance with an embodiment.

A cross-sectional side view of an illustrative electronic device of the type that may include a thermal management system is shown in FIG. 2. As shown in FIG. 2, device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Device 10 may have inner housing structures that provide additional structural support to device 10 and/or that serve as mounting platforms for printed circuits and other structures. Structural internal housing members may sometimes be referred to as housing structures and may be considered to form part of housing 12.

The front face of device 10 may be occupied by display 14 or may be partially occupied by display 14. The opposing rear face of device 10 may be covered by a rear wall of housing 12. The rear wall of housing 12 may contain windows such as windows 30. Windows 30 may be transparent to visible light and/or infrared light. As shown in FIG. 2, components may be mounted in alignment with windows 30. For example, light source 32 (e.g., a light-emitting diode) may emit light and light sensor 34 may receive reflected light from the body of a user or other external object. With this type of arrangement, light source 32 and light sensor 34 may form a light-based proximity sensor that determines whether or not a user's body or other external object is in the vicinity of the rear wall of device 10. Components such as components 32 and 34 may also be used as communications devices. In a configuration in which device 10 is a wristwatch device, the light-based proximity sensor on the rear of housing 12 may be used to determine whether device 10 is in a wrist-on or wrist-off configuration.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 of device 10 may be formed from a display module such as display module 22 mounted under a cover layer such as display cover layer 20 (as an example). Display 14 (display module 22) may be a liquid crystal display, an organic light-emitting diode display, a plasma display, an electrophoretic display, a display that is insensitive to touch, a touch sensitive display that incorporates and array of capacitive touch sensor electrodes or other touch sensor structures, or may be any other type of suitable display. Display cover layer 20 may be planar or curved and may be formed from clear glass, a transparent plastic member, a transparent crystalline member such as a sapphire layer, clear ceramics, other transparent materials, or combinations of these structures.

If desired, a liquid crystal shutter such as shutter 21 may be incorporated into display 14 (e.g., between display module 22 and display cover layer 20 or other suitable location in the layers of display 14). During normal operation, control circuitry 16 may place shutter 21 in an open state so that images from display module 22 of display 14 may be viewed by the user of device 10. In the event that a large amount of sunlight is determined to be incident on display 14, shutter 21 may be closed by control circuitry 16, thereby preventing the sunlight from reaching display 14 (i.e., display module 22) and raising the temperature of the display. Shutter 21 may, if desired, be implemented using mechanical structures (e.g., louvers, etc.), may be implemented using structures that exhibit increased reflectivity when activated, etc. The use of an electrostatically controlled component such as liquid crystal shutter 21 is merely illustrative.

Electrical components 26 may be mounted within the interior of housing 12. Components 26 may be mounted to printed circuits such as printed circuit 24 within the interior of housing 12. Printed circuit 24 may be a rigid printed circuit board (e.g., a printed circuit board formed from fiberglass-filled epoxy or other rigid printed circuit board material) or may be a flexible printed circuit (e.g., a printed circuit formed from a sheet of polyimide or other flexible polymer layer). Patterned metal traces within printed circuit board 24 may be used to form signal paths between components 26.

Ambient light conditions (i.e., the amount of solar radiation or other ambient light 40 that is incident on device 10) may be measured using ambient light sensor 42. Thermal sensors 44 may be used to measure internal device temperatures. Thermal sensors 44 may be mounted on display 14 (e.g., on display module 22), on printed circuit board 24, on the inner surface of the rear wall of housing 12, on other inner surfaces of housing walls in housing 12, on other components, etc.

Thermal sensors 44 may be based on surface mount technology (SMT) parts such as thermistors. Thermal sensors 44 may also be implemented within a microprocessor, an application specific integrated circuit, or other integrated circuits (see, e.g., components 26). There may be any suitable number of thermal sensors in device 10 (e.g., one or more, two or more, three or more, 4-15, more than 5, less than 20, nine, etc.). There may be, for example, four thermistors in device 10 and five temperature sensors incorporated into integrated circuits, there may be more than four thermistors or fewer than four thermistors, there may be more than five temperature sensors incorporated into integrated circuits, or other may be fewer than five temperature sensors incorporated into integrated circuits. If desired, other numbers of thermal sensors may be used. These are merely illustrative examples of how many thermal sensors may be used in device 10.

Using thermal modeling, the temperatures of different portions of device 10 may be predicted. Examples of temperatures that may be predicted (modeled) include the temperature on the exterior surface of display cover layer 20 of display 14 (temperature Td), the temperature of the exterior surface of the rear wall of housing 12 (temperature Tb), the temperature of display 14, and the internal temperatures of components 24 and other components in device 10. During use of device 10, a user may come into contact with the exterior of display 14, so knowledge of temperature Td can help ensure that display 14 does not become too hot to the touch of the user. Display 14 may also become degraded due to excess temperatures. For example, display 14 may exhibit reduced pixel lifetimes and/or undesired color shifts. Modeling of the temperature Td of display 14 during device operation can help minimize damage to display 14. Another temperature of interest is the rear housing temperature (temperature Tb). A user may touch the rear of housing 12. For example, if device 10 is held in a user's pocket or is worn against a user's wrist or other body part, excessive housing temperatures may be uncomfortable to the user. Using thermal modeling, rear housing temperature Tb may be predicted so that appropriate actions can be taken to ensure that Tb does not become too large.

In developing a thermal management model for device 10, the operation of device 10 may be characterized under a representative set of different operating conditions (e.g., different component settings such as different display brightnesses, different processor speeds, etc.), different environmental conditions (e.g., different ambient light conditions, different mounting positions on a user's body, etc.). Knowledge of device structures such as housing materials (metal versus plastic, etc.), component layouts, component structures and thermal characteristics, device dimensions (e.g., device diameter or other lateral dimensions, device thickness, etc.), the material used to construct a strap, lanyard, or removable cover that is coupled to device 10, and other structural device characteristics may also be taken into account. By taking into account structural device attributes, these attributes can be adjusted in the model when new versions of device 10 are produced (e.g., when a metal case version of a plastic case device is released), thereby allowing a single thermal management model (or at least a small number of models) to be used to model the behaviors of a relatively larger number of different versions of device 10.

Figure 3:
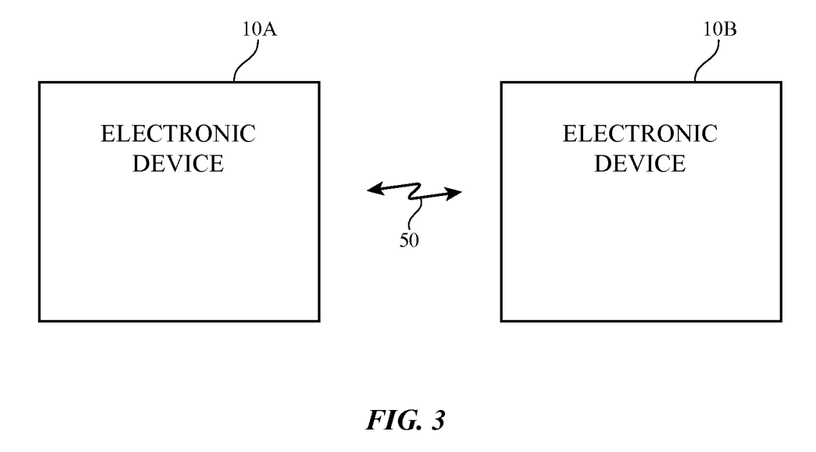
FIG. 3 is a system diagram of an illustrative system in which two electronic devices share data used in thermal management operations in accordance with an embodiment.

In some situations, device 10 may be used with another electronic device. For example, a first electronic device such as electronic device 10A may communicate with a second electronic device such as device 10B or other external electronic equipment over local wireless link 50, as shown in FIG. 3. Wireless link 50 may be a wireless local area network link that passes through additional wireless local area network equipment (e.g., a router, an access point, etc.) or may be a peer-to-peer link. Examples of short-range wireless protocols that may be used in forming link 50 include Bluetooth® and WiFi® (IEEE 802.11). Other wireless protocols may be used, if desired.

When devices are being used in conjunction with one another by a user (e.g., when two device are communicating with each other using local wireless link 50), the operating environments will be similar due to the relatively close proximity of the devices to each other. For example, if a device such as a wireless wrist-watch device (e.g., device 10A of FIG. 3) is being used in conjunction with a companion device such as a cellular telephone (e.g., device 10B of FIG. 3), changes in the amount of sunlight (solar radiation) incident on one device are likely to be experienced by the other device. Accordingly, if device 10B experiences a change in the amount of sunlight, device 10B can share this information with device 10A (and vice versa). The device that receives the shared environmental information (device 10A in this example) may then use this information to take suitable action based on predictions from the thermal management system. Although two electronic devices are shown in communication with each other in the example of FIG. 3, this is merely illustrative. In general, any suitable number of devices 10 may be linked using links such as link 50 (or wired links). For example, three or more devices 10 may share environmental data. The devices that share environmental data with each other may be operated by a common user or may be operated by different users (e.g., information may be shared between members of a group, among devices on a common local area network, devices being operated at a common venue, etc.).

Figure 4:
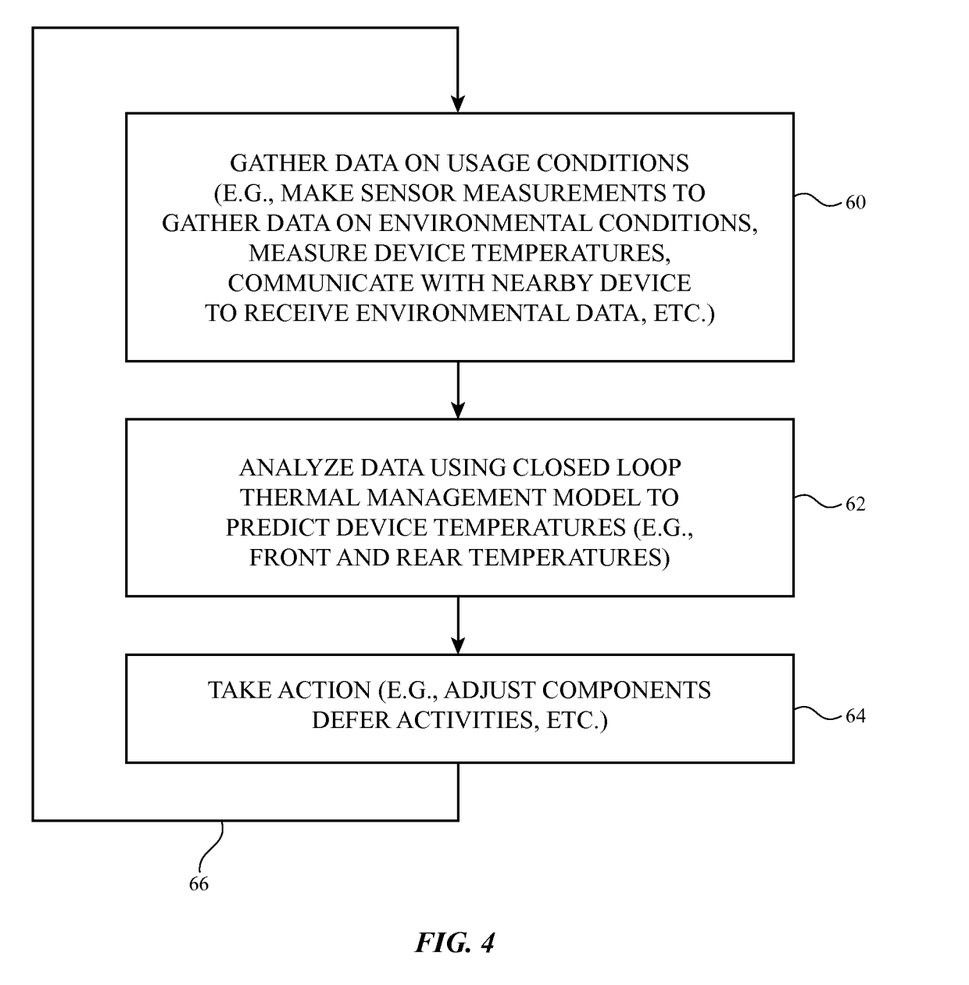
FIG. 4 is a flow chart of illustrative steps involved in operating an electronic device in accordance with an embodiment.

Illustrative steps involved in using a thermal management system to regulate device temperatures for device 10 are shown in FIG. 4. At step 60, device 10 may use control circuitry 16 to gather information on the operation of device 10. Information on usage conditions (i.e., the conditions under which device 10 is being operated) may be gathered using sensors, using information on the status of software running on control circuitry 16, using data receive from a nearby device as described in connection with FIG. 3, using input gathered from a user through button inputs, touch screen inputs, or voice command inputs, or using other suitable sources of information.

The information gathered at step 60 may include information from temperature sensors 44. For example, temperature sensors 44 in device 10 may measure the temperature of display 14, the temperature of portions of housing 12 such as sidewalls, a rear housing wall, or internal support structures. Temperature sensors 44 that are embedded within integrated circuits may gather integrated circuit operating temperatures at one or more locations within device 10. Temperature sensors mounted adjacent to light-emitting diodes may gather temperature measurements associated with activation of the light-emitting diodes (e.g., to produce light for a status indicator, for display backlight, for a light-based proximity sensor, etc.). Temperature sensors may be implemented using thermistors (temperature sensitive resistors), using thermocouples, or using other suitable temperature sensing devices.

In addition to making measurements of the temperatures in device 10 using temperature sensors 44, device 10 may use a temperature sensor to make ambient temperature measurements. For example, device 10 may gather ambient temperature readings using a temperature sensor mounted in a housing port that receives air from the exterior of device 10 or a temperature sensor that is otherwise exposed to the environment. In lower ambient temperature conditions, device 10 will tend to cool more readily than in higher ambient temperature conditions and this information may therefore be used as an input to the thermal management model when predicting temperatures and assessing appropriate actions to take.

Device 10 may also use one or more other sensors to gather data on the operating environment of device 10 during the activities of step 60.

Incident sunlight levels may be measured using ambient light sensor 42. The impact of directly sunlight on device temperature can be significant. When no direct sunlight is present, the heating of device 10 may be dominated by heat sources such as operating integrated circuits within housing 12. When direct sunlight is present, however, the amount of sunlight that is incident on device 10 may potentially have a larger impact on device 10 than the presence or absence of active integrated circuits within device 10. If desired, image sensor data can be used alone or in combination with ambient light sensor data to asses ambient light levels such as the amount of sunlight that is currently incident on device 10. Spectral data (e.g., color temperature data) can be measured and used to help determine whether light that is incident on device 10 is associated with sunlight or more moderate intensity indoor lighting.

The presence of moisture may influence heat dissipation rates. A moisture sensor and/or a pressure sensor may determine whether device 10 is submerged in water. When device 10 is underwater, excess heat may be dissipated more readily than when device 10 is not underwater.

Body activity levels can influence the rate of heat dissipation from device 10. When a user's body is generating heat due to physical exertion, device 10 may be heated through contact with the user's warm body and it may be difficult to cool device 10. In the absence of activity, device 10 may cool more rapidly. Body activity levels may be ascertained using an accelerometer to measure motion, using a global position system circuit to produce a reading to evaluate movement, using software status information (e.g., software status information that is indicative of whether a workout application such as a running or biking mapping application is active or not), using a moisture sensor to detect perspiration indicative of higher levels of activity, making other measurements, or using a combination of these measurements to asses activity level.

Device 10 (e.g., a thermal management model) can determine where device 10 is currently located relative to a user. For example, in scenarios in which device 10 is a wearable device, the current location of device 10 relative to the body of the user can be determined using proximity sensors, cameras, force sensors, light-based sensors, capacitive sensors, temperature sensors, and other sensors. A wristwatch device may, as an example, be provided with a proximity sensor such as the light-based proximity sensor formed from components 32 and 34 of FIG. 2. This sensor may sense whether or not a user's wrist or other body part is located immediately adjacent to the rear wall of housing 12. When the user's body is not sensed as being present by the proximity sensor, control circuitry 16 may conclude that device 10 is not being worn on the wrist or other body part of the user. When the proximity sensor detects the presence of an external object, control circuitry 16 can conclude that the wrist of the user or other body part is adjacent to the rear face of housing 12. Capacitive proximity sensors may also be used to measure for the presence of the user's body in the vicinity of device 10 (e.g., the rear of device 10). A temperature sensor may monitor for heat produced by a user's body. For example, a temperature sensor may be incorporated into the rear wall of housing 12 or may be incorporated into a wrist band for device 10. When an object having the temperature of a human body is detected, control circuitry 16 can conclude that device 10 is currently being worn by a user. By using a force sensor in a wrist strap or other portion of device 10, control circuitry 16 can monitor whether or not the wrist strap (and therefore device 10) is being worn by a user. A clasp sensor may also be used to determine whether a wrist strap is open (device 10 is not being worn) or closed (i.e., device is being worn).

Using sensors such as these, using other sensors, or using a combination of sensors, device 10 can determine whether device 10 is in a wrist-on or wrist-off condition or is otherwise being worn or not worn by a user. When device 10 is being worn, body heat and thermal resistance from the presence of the user's body may impede heat dissipation. When device 10 is not being worn, heat may be more freely dissipated by air flowing around device 10.

Electrical components within device 10 that generate heat and/or that are sensitive to heat may be located within specific portions of housing 12. For example, display 14 may be mounted to the front of housing 12. As a result, heat dissipation from display 14 may be affected by whether display 14 is resting against a table top or other surface or is facing upwards. Device 10 may use an accelerometer to measure the direction in which the Earth's gravity is acting on device 10 and thereby determine the orientation of device 10 relative to the surface of the earth. When device 10 is in a face up condition, more heat may be dissipated from display 14 than when device 10 is in a face down condition. At the same time, more sunlight may be incident on display 14 of device 10 when device 10 is in a face up condition than when device 10 is in a face down condition. An ambient light sensor such as sensor 42 of FIG. 2 may provide data for analysis by control circuitry 16 in conjunction with accelerometer data. If, for example, device 10 determines that device 10 is in a face up condition and the signal from ambient light sensor 42 is low, device 10 can conclude that heat dissipation from display 14 will be relatively effective. In device is face up, but sensor 42 measures large amounts of incident light, device 10 can conclude that display 14 is being heated by sunlight and can take this heating into account in assessing which actions to take to mitigate the effects of heat. If device 10 is face down, device 10 can conclude that display 14 is not being illuminated by sunlight, although heat dissipation from display 14 may be impeded somewhat by reduced airflow.

In addition to using an accelerometer to discriminate between face-up and face-down conditions, ambient light sensor data can be used to discriminate between face-up and face-down (e.g. dark signals indicating face down and light signals indicating face up), proximity sensor data can be used (front proximity sensor readings being low indicating face up and being high indicating face down, ear proximity sensor readings being high indicating face up and being low indicating face down, etc.), and/or combinations of these signals may be used to improve accuracy when determining device orientation relative to a resting surface such as a table top.

External airflow may affect heat dissipation. For example, when device 10 is at rest, there may be relatively little airflow over device 10. If, however, device 10 is being worn on the wrist of a cyclist in motion, airflow over device 10 may substantially impact cooling efficiency. Using accelerometer data and data from a global positioning system circuit or other satellite navigation system data, device 10 can determine whether device 10 is being used by a cyclist. The speed at which device 10 is moved in this scenario will be faster than a walking pace, but less than is associated with using an automobile. Accelerometer data can also be analyzed to monitor for the characteristics of cyclist activities (i.e., the magnitudes and frequencies of device movement that are characteristic of use of device 10 by a cyclist). Use of device 10 in a high airflow condition versus low airflow condition may also be ascertained by determining which application or other software is being actively used by the user. If, for example, device 10 is running a cycling mapping application or other cycling training application, device 10 can conclude that device 10 is being operated while a user is riding a bicycle.

The personal characteristics of a user's body may also affect heat dissipation from device 10. For example, the size of a user's wrist or other body part on which device 10 is being worn or the amount of hair present on the user's skin where device 10 is being worn may affect the rate at which heat is dissipated. Heat may be dissipated at different rates depending on whether device 10 is located on a user's wrist, arm, leg, head, or other body location. Wrist size or other body part size, the mounting location of device 10 on a user's body, and other body attributes that influence heat dissipation from device 10 may be determined by querying the user through input-output devices 18 (e.g., by issuing on-screen prompts to the user that the user can respond to), may be determined using a wrist strap sensor or other sensor incorporated into a strap or other structures used in attaching device 10 to the user (e.g., a force sensor or a sensor in the strap that determines current strap length), or may be monitored using other sensors (e.g., light sensors, capacitive proximity sensors, or other sensors whose output varies as a function of strap/wrist size, hair quantity, device location on the user's body, or other personal user characteristics).

During step 62, the data that has been gathered during step 60 may be analyzed by control circuitry 16 (and/or processing circuitry in an associated companion device or remote server). A thermal management model running on control circuitry 16 may be used to make predictions of device temperatures such as one or more internal device temperatures (temperatures in the interior of housing 12), one or more component temperatures (e.g., temperatures for integrated circuits, display 14, or other components 26), and/or surface temperatures (e.g., temperature Td for display 14 on the front surface of device 10 or temperature Tb for the housing wall in housing 12 on the rear of device 10). Maximum target temperatures may be established based on desired component operating temperatures (e.g., maximum temperatures for display 14, integrated circuits, and other components 26), maximum comfortable surface temperatures for housing 12 (e.g., a maximum comfortable temperature Tb for the rear of housing 12 or other portions of housing 12 that may contact a user's wrist or other body part when device 10 is being worn by a user), etc. These maximum temperatures may serve as predetermined threshold values to which the thermal management model may compare temperature predictions.

In making predictions of temperature, the thermal management model may take into account device characteristics such as housing material, strap material, housing shape and size, component placement and materials, etc. The thermal management model may also take into account the impact of the various types of conditions that were evaluated during the data gathering operations of step 60 (e.g., device usage mode, device location relative to the user, sensor data indicating the status of environmental conditions, etc.). Temperature measurements make using temperature sensors 44 may also be analyzed. During analysis, the thermal management model may use as inputs the data gathered during step 60 including temperature measurements from sensors 44, information from other sensors, information received from external electronic devices, and information on the thermal properties of device 10 based on the housing material for housing 12 and other device characteristics. These inputs may be used by the model to predict device temperatures (e.g., temperatures Td and Tb, internal temperatures, etc.). Based on comparisons of these predicted device temperatures to target values (e.g., predetermined maximum temperatures or other target operating conditions), the model can determine which actions should be taken in response. The actions taken (at step 64) may involve taking remedial action to reduce heat production in device 10 or making adjustments to resume normal heat production following earlier remedial action.

If, for example, the thermal management model determines that device 10 is experiencing or is about to experience an excessive temperature rise, remedial actions may be taken. Examples of remedial actions that may be taken to lower device temperatures include adjusting components 26 so that the components produce less heat, deferring processor-intensive activities such as syncing data with a remote source, downloading software updates, or downloading or uploading other information, and deploying liquid crystal shutter 21 to block incoming sunlight and thereby reduce heating of device 10 to prevent overheating.

Components that produce heat in device 10 may include, for example, display 14. When excess heating is detected, the brightness setting for display 14 may be adjusted so that the display produces less heat. Integrated circuits such as processors and application-specific integrated circuits may be adjusted to reduce processing intensity (e.g., clock speed, the number of active cores in a multicore system, the amount of supplemental processing being provided by a co-processor or other ancillary circuit, the number of cycles being dedicated to a given activity in a time-division multiplexing scheme, the number of parallel threads that are being supported in a multithreading system, etc.). Audio volume may be decreased to conserve power and reduce heat production in an audio circuit, wireless or wired transmission speeds may be reduced for communications circuits that are in use or other communications activity levels may be reduced, sensor sampling rates may be decreased, brightness settings for light-emitting diodes in status indicators can be reduced, vibrator amplitudes and the amplitudes associated with other electromechanical actuators can be reduced, tone generator volumes can be reduced, and other component settings may be adjusted to reduce power consumption and heat production.

In situations in which device 10 is determined to be operating below the predetermined threshold values, remedial activities can be stopped and adjustments made to the operation of device 10 that result in more heat production.

Communications activity and other software operations may be adjusted based on thermal conditions. If messages are awaiting transmission (e.g., email messages, etc.), these activities can be deferred when the thermal management system model predicts that device temperatures will exceed predetermined threshold values. If desired, information transmission (or reception) activities can be suspended for all traffic and/or for particular heat-generating traffic (e.g., for all messages, for all messages over a certain size, for all messages having attachments or other attributes that may result in significant power consumption and heat production), etc. Other communications operations and software activity levels can also be increased or decreased to manage heat production in device 10 (e.g., database maintenance operations, image processing operations, audio and video functions, etc.).

In some situations, the thermal management model may determine that device temperatures are satisfactorily low to permit normal operation. In these situations, previously deferred operations such as syncing and downloads/uploads or other software operations may be resumed, components that had previously been adjusted to reduce heat production can be adjusted to resume normal functions at higher heat production levels, and other normal device activities may be resumed.

In general, device 10 (e.g., a thermal management model implemented on control circuitry 16) can adjust component settings, can adjust activity levels, or can activate or deactivate light shutters or other heat mitigation components to manage heat production by device 10. Examples of component settings that can be adjusted include display brightness and processing intensity for a processor or other circuit. Activity levels (e.g., software activity levels) that can be adjusted include deferring/resuming communications. For example, if too much activity is present, downloading activity, uploading activity, or other data communications activity can be adjusted downwards by suspending these activities or restricting these activities so that less heat is produced. If the measured amount of activity is low, downloading activity, uploading activity, or other data communications activity (e.g., wireless communications activity) can be adjusted upwards by resuming previously suspended activities or by removing restrictions to previously restricted activities). Other software activity levels that may be adjusted up or down include internal housekeeping operations (building or maintain a database, deleting files, updating logs, etc.), image processing operations, operations involved in performing status updates, or operations for other application functions or operation system functions. The software activity levels that may be adjusted upwards or downwards in intensity based on determinations from the thermal management model may sometimes be referred to as software processing levels or processing activity levels.

The process of making sensor measurements and gathering other data at step 60 may reveal correlations between activities and temperatures that can allow enhancements to be made to the accuracy of the thermal management model. For example, a strong correlation may be noticed between ambient light levels and display temperature. Data on these correlations may be stored in a database in device 10 so that control circuitry 16 can dynamically update and improve the thermal management model.

As shown in FIG. 4, following the actions of step 64, processing may loop back to the operations of step 60 so that additional data may be gathered by control circuitry 16. If desired, data gathering operations and component adjustments and/or activity level adjustments may be made concurrently.

The foregoing is merely illustrative and various modifications can be made by those skilled in the art without departing from the scope and spirit of the described embodiments. The foregoing embodiments may be implemented individually or in any combination.

What is claimed is:

1. A method for operating an electronic device, comprising:
   with a sensor of the electronic device, gathering sensor data, wherein the sensor data is indicative of whether the electronic device is submerged in water;
   with control circuitry in the electronic device, receiving information from external equipment over a wireless link while the electronic device is submerged in water;
   with the control circuitry, implementing a thermal management model that uses the sensor data as an input and that produces a predicted device temperature based on the sensor data; and
   with the control circuitry, managing heat production in the electronic device based on the predicted device temperature.

2. The method defined in claim 1 wherein the electronic device comprises a wristwatch.

3. The method defined in claim 2 wherein managing the heat production comprises adjusting an electrical component in the electronic device.

4. The method defined in claim 2 wherein managing the heat production comprises adjusting a wireless communications activity level.

5. The method defined in claim 4 wherein adjusting the wireless communications activity level comprises deferring a software download.

6. The method defined in claim 4 wherein adjusting the wireless communications activity level comprises deferring a data syncing operation.

7. The method defined in claim 6 wherein receiving the information from the external equipment comprises receiving the information from a cellular telephone.

8. The method defined in claim 7 wherein receiving the information from the cellular telephone comprises receiving information gathered using a sensor of the cellular telephone.

9. The method defined in claim 1 wherein receiving the information from the external equipment comprises receiving information gathered from an ambient light sensor of the external equipment.

10. A method of operating an electronic device to avoid overheating, comprising:
gathering data using at least one sensor that is indicative of whether the electronic device is in a face down or face up configuration, wherein the face down configuration and the face up configuration each has a different effect on heat received and dissipated through a face of the electronic device; and
managing heat production in the electronic device using control circuitry in the electronic device based at least partly on the gathered data.

11. The method defined in claim 10 wherein the electronic device has a display and a rear housing wall opposite the display, wherein the display faces upwards and the rear housing wall faces downwards when the electronic device is in the face up configuration, and wherein the display faces downwards and the rear housing wall faces upwards when the electronic device is in the face down configuration.

12. The method defined in claim 11 wherein the sensor comprises an accelerometer and wherein gathering the data comprises gathering accelerometer data indicative of whether the electronic device is in a face down or face up configuration.

13. The method defined in claim 11 wherein the sensor comprises a light-based proximity sensor and wherein gathering the data comprises gathering proximity sensor data with the light-based proximity sensor indicative of whether the electronic device is in the face up or face down configuration.

14. The method defined in claim 13 wherein the light-based proximity sensor is configured to receive sun light through a cover layer for the display.

15. The method defined in claim 14 wherein the control circuitry is configured to manage the heat production in the electronic device based on whether the electronic device is in the face up or face down configuration in addition to an amount of the sun light that is received by the light-based proximity sensor.

16. The method defined in claim 10 wherein the electronic device comprises a wristwatch and wherein managing the heat production comprises adjusting a wireless communications activity level for the electronic device.

17. An electronic device comprising:
a display;
a housing having a rear wall opposite the display and having a sidewall configured to receive a wrist strap;
a sensor, wherein the sensor is configured to gather sensor data indicative of whether the electronic device is in an off-wrist or on-wrist configuration, and wherein the sensor comprises a sensor selected from the group consisting of: a temperature sensor incorporated into the rear wall, a temperature sensor incorporated into the wrist strap, a force sensor incorporated into the wrist strap, and a clasp sensor configured to determine whether the wrist strap is open; and
control circuitry coupled to the sensor and configured to manage heat production in the electronic device based at least partly on the gathered sensor data, wherein the sensor data identifies that the electronic device is in the on-wrist configuration when the temperature sensor detects an object at a temperature of a human body.

18. The electronic device defined in claim 17, wherein the electronic device comprises a wristwatch and wherein the control circuitry is configured to manage the heat production by adjusting an electrical component in the electronic device.

19. The electronic device defined in claim 17, wherein the electronic device comprises a wristwatch and wherein the control circuitry is configured to manage the heat production by adjusting a wireless communications activity level for the electronic device.

20. The electronic device defined in claim 17, wherein the sensor data identifies that the electronic device is in the off-wrist configuration when the clasp sensor determines that the wrist strap is open, and wherein the sensor data identifies that the electronic device is in the on-wrist configuration when the clasp sensor determines that the wrist strap is closed.

* * * * *